(12) United States Patent
Choi et al.

(10) Patent No.: US 10,505,512 B2
(45) Date of Patent: Dec. 10, 2019

(54) TUNABLE INDUCTOR CIRCUIT

(71) Applicant: Samsung Electro-Mechanics Co., LTD., Gyeonggi-do (KR)

(72) Inventors: Kyu Jin Choi, Suwon-si (KR); Jae Hyouck Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 70 days.

(21) Appl. No.: 15/809,062

(22) Filed: Nov. 10, 2017

(65) Prior Publication Data
US 2018/0287581 A1 Oct. 4, 2018

(30) Foreign Application Priority Data
Mar. 31, 2017 (KR) .......................... 10-2017-0041603

(51) Int. Cl.
*H03H 7/38* (2006.01)
(52) U.S. Cl.
CPC .................................... *H03H 7/38* (2013.01)
(58) Field of Classification Search
CPC .. H03H 7/38; H03H 7/0115; H03H 2210/026; H01F 21/12
USPC .......................................................... 333/33
See application file for complete search history.

(56) References Cited

U.S. PATENT DOCUMENTS

| 5,629,553 | A | 5/1997 | Ikeda et al. |
| 6,970,040 | B1 | 11/2005 | Dening |
| 2004/0104785 | A1 | 6/2004 | Park et al. |
| 2014/0375389 | A1 | 12/2014 | Jeon et al. |
| 2015/0091683 | A1* | 4/2015 | Yen .......................... H01F 21/12 336/150 |

FOREIGN PATENT DOCUMENTS

| JP | 8-45744 A | 2/1996 |
| KR | 10-2004-0048005 A | 6/2004 |
| KR | 10-2013-0060756 A | 6/2013 |

OTHER PUBLICATIONS

Chakraborty et al., Paradigm Phase Shift: RF MEMS Phase Shifters: An Overview, IEEE Microwave Magazine, Jan. 2017, pp. 22-41 (Year: 2017).*
Korean Office Action dated Feb. 23, 2018 in corresponding Korean Patent Application No. 10-2017-0041603 (5 pages in English and 5 pages in Korean).

* cited by examiner

Primary Examiner — Benny T Lee
Assistant Examiner — Hafizur Rahman
(74) Attorney, Agent, or Firm — NSIP Law

(57) ABSTRACT

A tunable inductor circuit includes a first common transmission line having one end connected to a first terminal; a first uncommon transmission line having one end connected to another end of the first common transmission line; a first switch circuit configured to selectively connect one of the other end of the first common transmission line and another end of the first uncommon transmission line to a first common node; a second common transmission line having one end connected to the first common node; a second uncommon transmission line having one end connected to another end of the second common transmission line; and a second switch circuit configured to selectively connect one of the other end of the second common transmission line and another end of the second uncommon transmission line to a second terminal.

14 Claims, 6 Drawing Sheets

TUNABLE INDUCTOR CIRCUIT

CROSS-REFERENCE TO RELATED APPLICATIONS

This application claims the benefit under 35 USC 119(a) of Korean Patent Application No. 10-2017-0041603 filed on Mar. 31, 2017, in the Korean Intellectual Property Office, the entire disclosure of which is incorporated herein by reference for all purposes.

BACKGROUND

1. Field

The following description relates to a tunable inductor circuit.

2. Description of Related Art

The trend toward broadband, multimedia, intelligence in next generation wireless communications systems has increased the demand for broadband, linearity, and intelligence in radio-frequency (RF) power amplifiers.

In addition, as demand for communications technology having a higher data rate has increased, research and development of a design of a power amplifier having a wide bandwidth in a radio frequency (RF) front end has increased.

In such a power amplifier, it is necessary to implement matching by optimized impedances depending on a frequency in use to obtain a wide bandwidth, and to do this, it is necessary to implement a variable impedance circuit in an integrated circuit.

Among the existing variable impedance circuits, there is a variable capacitance circuit implemented in an on-chip form, but it is difficult to implement a variable inductance circuit in an on-chip form.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a tunable inductor circuit includes a first common transmission line having one end connected to a first terminal; a first uncommon transmission line having one end connected to another end of the first common transmission line; a first switch circuit configured to selectively connect one of the other end of the first common transmission line and another end of the first uncommon transmission line to a first common node; a second common transmission line having one end connected to the first common node; a second uncommon transmission line having one end connected to another end of the second common transmission line; and a second switch circuit configured to selectively connect one of the other end of the second common transmission line and another end of the second uncommon transmission line to a second terminal.

The first switch circuit may include a first switch device connected between the other end of the first common transmission line and the first common node; and a second switch device connected between the other end of the first uncommon transmission line and the first common node.

The first switch device may include a first bipolar junction transistor (BJT); the second switch device may include a second BJT; and the first BJT and the second BJT may be configured to perform complementary switching operations in which one of the first BJT and the second BJT is on and another one of the first BJT and the second BJT is off in response to respective control signals having opposite phases.

The second switch circuit may include a first switch device connected between the other end of the second common transmission line and the second terminal; and a second switch device connected between the other end of the second uncommon transmission line and the second terminal.

A transmission length of the first common transmission line may be different from a transmission length of the second uncommon transmission line.

In another general aspect, a tunable inductor circuit includes first to n-th common transmission lines included in a common signal path; first to n-th uncommon transmission lines included in a bypass signal path; and first to n-th switch circuits; wherein the first common transmission line has one end connected to a first terminal included in the common signal path, the first uncommon transmission line has one end connected to another end of the first common transmission line, and the first switch circuit is configured to selectively connect one of the other end of the first common transmission line and another end of the first uncommon transmission line to a first common node included in the common signal path; the second common transmission line has one end connected to the first common node, the second uncommon transmission line has one end connected to another end of the second common transmission line, and the second switch circuit is configured to selectively select one of the other end of the second common transmission line and another end of the second uncommon transmission line to a second common node included in the common signal path; and the n-th common transmission line has one end connected to an n−1-th common node included in the common signal path, the n-th uncommon transmission line has one end connected to another end of the n-th common transmission line, and the n-th switch circuit is configured to selectively connect one of the other end of the n-th common transmission line and another end of the n-th uncommon transmission line to a second terminal included in the common signal path.

The first switch circuit may include a first switch device connected between the other end of the first common transmission line and the first common node; and a second switch device connected between the other end of the first uncommon transmission line and the first common node.

The first switch device may include a first bipolar junction transistor (BJT); the second switch device may include a second BJT; and the first BJT and the second BJT may be configured to perform complementary switching operations in which one of the first BJT and the second BJT is on and another one of the first BJT and the second BJT is off in response to respective control signals having opposite phases.

The second switch circuit may include a first switch device connected between the other end of the second common transmission line and the second common node; and a second switch device connected between the other end of the second uncommon transmission line and the second common node.

The n-th switch circuit may include a first switch device connected between the other end of the n-th common transmission line and the second terminal; and a second switch device connected between the other end of the n-th uncommon transmission line and the second terminal.

Respective transmission lengths of the first to n-th common transmission lines may be different from one another.

In another general aspect, a tunable inductor circuit includes a common transmission line connected between a first terminal and a second terminal; n switch circuits connected inline in the common transmission line at n−1 nodes and the second terminal; and n loop transmission lines each having a first end connected to the common transmission line at a respective one of the n−1 nodes and the second output terminal, and a second end connected to a respective one of the n switch circuits; wherein each of the n switch circuits is configured to receive a first signal from the common transmission line and output the first signal to a respective one of the n−1 nodes and the second terminal in a first switching state, and receive a second signal from a respective one of the n loop transmission lines and output the second signal to the respective one of the n−1 nodes and the second terminal in a second switching state.

Each of the n switch circuits may include a first switch device connected inline in the common transmission line at a respective one of the n−1 nodes and the second terminal; and a second switch device connected between the second end of a respective one of the n loop transmission lines and the respective one of the n−1 nodes and the second terminal.

The first switch device may include a first bipolar junction transistor (BJT); the second switch device may include a second BJT; and the first BJT and the second BJT may be configured to perform complementary switching operations in which one of the first BJT and the second BJT is on and another one of the first BJT and the second BJT is off in response to respective control signals having opposite phases.

The n−1 nodes may be disposed at unequal intervals in the common transmission line.

Respective transmission lengths of the n loop transmission lines may be different from one another.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
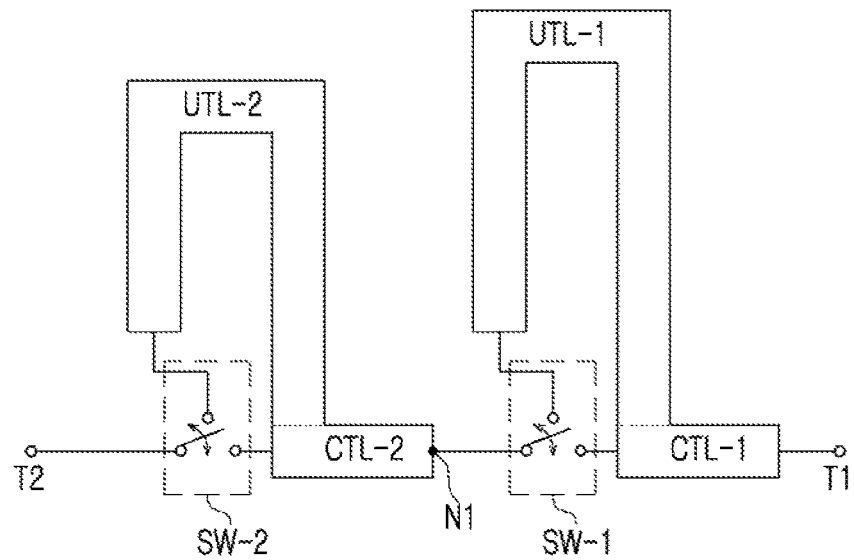
FIG. 1 is a circuit diagram illustrating an example of a tunable inductor circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art maybe omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or wafer (substrate), is described as being "on," "connected to," or "coupled to" another element, it can be directly "on," "connected to," or "coupled to" the other element, or there may be one or more other elements intervening therebetween. In contrast, when an element is referred to as being "directly on," "directly connected to," or "directly coupled to" another element, there can be no other element intervening therebetween.

As used herein, the term "and/or" includes any one and any combination of any two or more of the associated listed items.

Although terms such as "first," "second," and "third" maybe used herein to describe various members, components, regions, layers, and/or sections, these members, components, regions, layers, and/or sections are not to be limited by these terms. Rather, these terms are only used to distinguish one member, component, region, layer, or section from another member, component, region, layer, or section. Thus, a first member, component, region, layer, or section referred to in an example below could also be referred to as a second member, component, region, layer, or section without departing from the teachings of the example.

Spatially relative terms, such as "above," "upper," "below," and "lower," may be used herein for ease of description to describe one element's relationship to another element as shown in the figures. Such spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements. Thus, the term "above" can encompass both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing particular examples only, and is not intended to limit the disclosure. The terms "a," "an," and "the" include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described below are not to be construed as being limited to the particular shapes of regions shown in the drawings, but include changes in shape occurring during manufacturing.

In this Detailed Description, a repeated description of elements denoted by the same reference numerals and having the same functions may be omitted, and only elements denoted by different reference numerals and having different functions may be described.

FIG. 1 is a circuit diagram illustrating an example of a tunable inductor circuit.

Referring to FIG. 1, the tunable inductor circuit includes a first common transmission line CTL-1, a first uncommon transmission line UTL-1, a first switch circuit SW-1, a second common transmission line CTL-2, a second uncommon transmission line UTL-2, and a second switch circuit SW-2. A common transmission line is a transmission line through which a signal always flows regardless of a state of the tunable inductor circuit. An uncommon transmission line is a transmission line through which a signal flows only some of the time depending on the state of the tunable inductor circuit. In the example in FIG. 1, the first and second uncommon transmission lines UT-1 and UTL-2 have a loop form, and thus are loop transmission lines.

The first common transmission line CTL-1 has one end connected to a first terminal T1 and the other end connected to one end of the first uncommon transmission line UTL-1. The first uncommon transmission line UTL-1 has one end connected to the other end of the first common transmission line CTL-1 and the other end connected to the first switch circuit SW-1. The first switch circuit SW-1 selectively connects one of the other end of the first common transmission line CTL-1 and the other end of the first uncommon transmission line UTL-1 to a first common node N1 depending on a switching state of the first switch circuit SW-1. For example, the first switch circuit SW-1 connects the other end of the first common transmission line CTL-1 to the first common node N1 in a first switching state of the first switch circuit SW-1, and connects the other end of the first uncommon transmission line UTL-1 to the first common node N1 in a second switching state of the first switch circuit SW-1.

Therefore, when the first switch circuit SW-1 connects the first common node N1 to the other end of the first common transmission line CTL-1, the first common transmission line CTL-1 is selected as a transmission line. Alternatively, when the first switch circuit SW-1 connects the first common node N1 to the other end of the first uncommon transmission line UTL-1, a series connection of the first common transmission line CTL-1 and the first uncommon transmission line UTL-1 is selected as a transmission line.

That is, an electrical length of the transmission line is adjusted depending on a switching operation of the first switch circuit SW-1.

The second common transmission line CTL-2 has one end connected to the first common node N1 and the other end connected to one end of the second uncommon transmission line UTL-2. The second uncommon transmission line UTL-2 has one end connected to the other end of the second common transmission line CTL-2 and the other end connected to the second switch circuit SW-2. The second switch circuit SW-2 selectively connects one of the other end of the second common transmission line CTL-2 and the other end of the second uncommon transmission line UTL-2 to a second terminal T2 depending on a switching state of the second switch circuit SW-2.

Therefore, when the second switch circuit SW-2 connects the second terminal T2 to the other end of the second common transmission line CTL-2, the second common transmission line CTL-2 is selected as a transmission line. Alternatively, when the second switch circuit SW-2 connects the second terminal T2 to the other end of the second uncommon transmission line UTL-2, a series connection of the second common transmission line CTL-2 and the second uncommon transmission line UTL-2 is selected as a transmission line.

That is, an electrical length of the transmission line is adjusted depending on a switching operation of the second switch circuit SW-2.

In the example in FIG. 1, the first common transmission line CTL-1 has a transmission length that is different from a transmission length of the second uncommon transmission line UTL-2.

Figure 2:
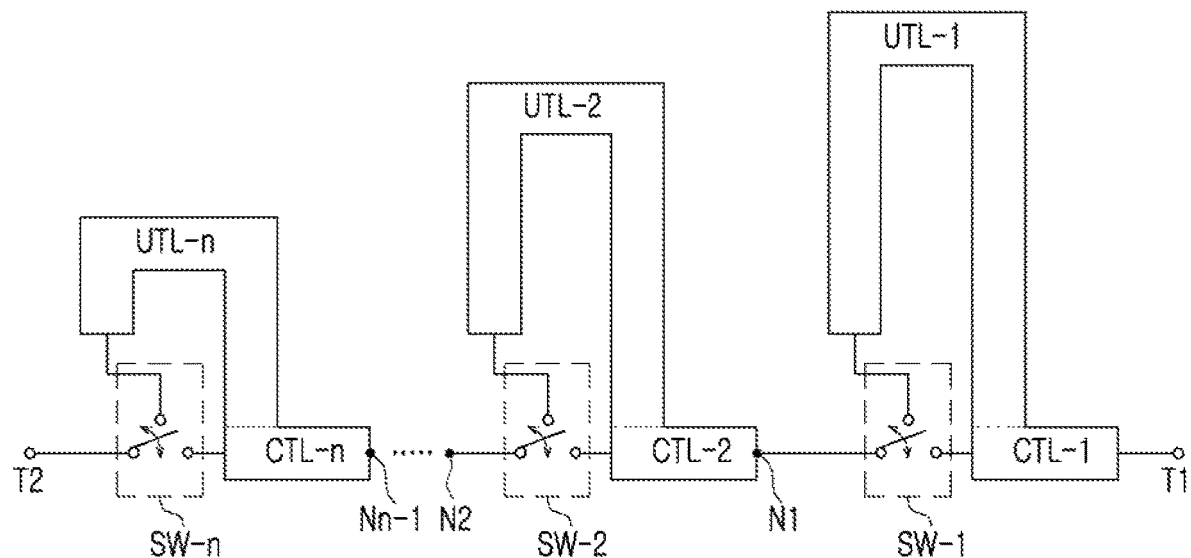
FIG. 2 is a circuit diagram illustrating another example of a tunable inductor circuit.

FIG. 2 is a circuit diagram illustrating another example of a tunable inductor circuit.

Referring to FIG. 2, the tunable inductor circuit includes first to n-th common transmission lines CTL-1 to CTL-n included in a common signal path, first to n-th uncommon transmission lines UTL-1 to UTL-n included in a bypass signal path, and first to n-th switch circuits SW-1 to SW-n.

Operations of the first and second common transmission lines CTL-1 and CTL-2, the first and second uncommon transmission lines UTL-1 and UTL-2, and the first and second switch circuits SW-1 and SW-2 in FIG. 2 are the same as the same elements described with reference to FIG. 1 except that the second terminal T2 in FIG. 1 is replaced by a second common node N2 in FIG. 2, and a description thereof has therefore been omitted.

Referring to FIG. 2, the n-th common transmission line CTL-n (n is a natural number of 3 or more) has one end connected to the n−1-th common node Nn−1 and the other end connected to one end of the n-th uncommon transmission line UTL-n. The n-th uncommon transmission line UTL-n has one end connected to the other end of the n-th common transmission line CTL-n and the other end connected to the n-th switch circuit SW-n. The n-th switch circuit SW-n selectively connects one of the other end of the n-th common transmission line CTL-n and the other end of the n-th uncommon transmission line UTL-n to a second terminal T2 included in the common signal path depending on a switching state of the n-th switch circuit SW-n.

Therefore, when the n-th switch circuit SW-n connects the second terminal T2 to the other end of the n-th common transmission line CTL-n, the n-th common transmission line CTL-n is selected as a transmission line. Alternatively, when the n-th switch circuit SW-n connects the second terminal T2 to the other end of the n-th uncommon transmission line UTL-n, a series connection of the n-th common transmission line CTL-n and the n-th uncommon transmission line UTL-n is selected as a transmission line.

That is, an electrical length of the transmission line is adjusted depending on a switching operation of the n-th switch circuit SW-n.

In one example, the first to n-th common transmission lines CTL-1 to CTL-n have different transmission lengths. That is, respective transmission lengths of the first to n-th common transmission lines CTL-1 to CTL-n may be different from one another so that the tunable inductor circuit has transmission lines of various lengths, but are not limited thereto. In this example, the n−1 nodes are disposed at unequal intervals in the common signal path including the first to n-th common transmission lines CTL-1 to CTL-n.

In the example illustrated in FIG. 2, the first to n-th uncommon transmission lines UTL-1 to UTL-n have different transmission lengths. That is, respective transmission lengths of the first to n-th uncommon transmission lines UTL-1 to UTL-n may be different from one another so that the tunable inductor circuit has transmission lines of various lengths, but are not limited thereto.

Figure 3:
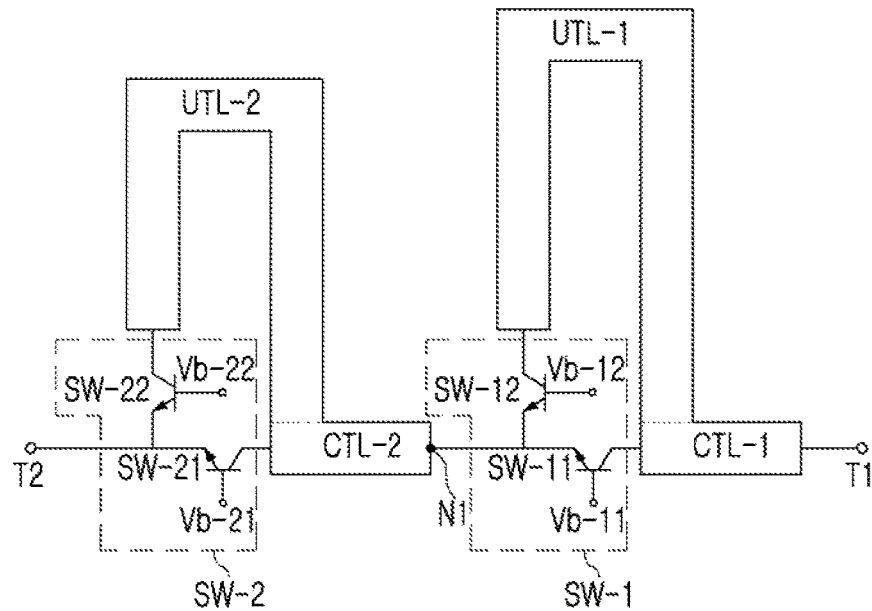
FIG. 3 is a circuit diagram illustrating an example of first and second switch circuits.
Figure 4:
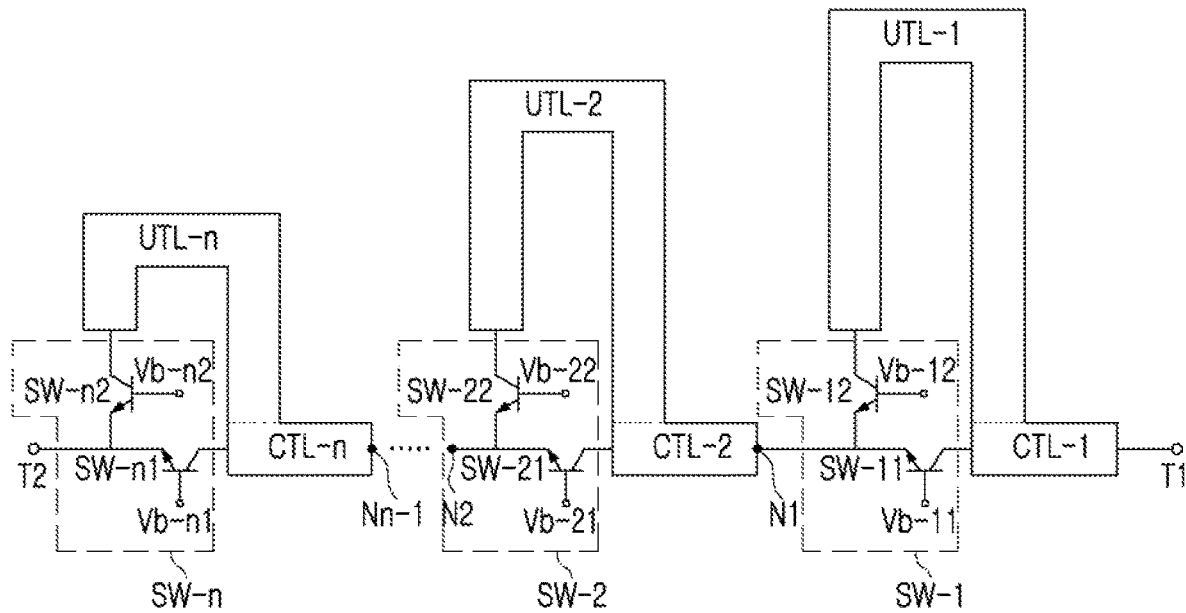
FIG. 4 is a circuit diagram illustrating an example of first to n-th switch circuits.

FIG. 3 is a circuit diagram illustrating an example of first and second switch circuits, and FIG. 4 is a circuit diagram illustrating an example of first to n-th switch circuits.

Referring to FIGS. 3 and 4, the first switch circuit SW-1 includes a first switch device SW-11 and a second switch device SW-12.

The first switch device SW-11 of the first switch circuit SW-1 is connected between the other end of the first common transmission line CTL-1 and the first common node N1.

The second switch device SW-12 of the first switch circuit SW-1 is connected between the other end of the first uncommon transmission line UTL-1 and the first common node N1.

In one example, each of the first and second switch devices SW-11 and SW-12 of the first switch circuit SW-1 is a bipolar junction transistor (BJT). In this case, the first and second switch devices SW-11 and SW-12 of the first switch circuit SW-1 perform complementary switching operations depending on two control signals Vb-11 and Vb-12 having opposite phases to selectively connect one of the other end of the first common transmission line CTL-1 and the other end of the first uncommon transmission line UTL-1 to the first common node N1. In the complementary switching operations, one of the BJTs is on and the other one of the BJTs is off.

The second switch circuit SW-2 includes a first switch device SW-21 and a second switch device SW-22.

The first switch device SW-21 of the second switch circuit SW-2 is connected between the other end of the second common transmission line CTL-2 and the second terminal T2.

The second switch device SW-22 of the second switch circuit SW-2 is connected between the other end of the second uncommon transmission line UTL-2 and the second terminal T2.

In one example, each of the first and second switch devices SW-21 and SW-22 of the second switch circuit SW-2 is a BJT. In this case, the first and second switch devices SW-21 and SW-22 of the second switch circuit SW-2 perform complementary switching operations depending on two control signals Vb-21 and Vb-22 having opposite phases to selectively connect one of the other end of the second common transmission line CTL-2 and the other end of the second uncommon transmission line UTL-2 to the second terminal T2.

Referring to FIG. 4, the n-th switch circuit SW-n includes a first switch device SW-n1 and a second switch device SW-n2.

The first switch device SW-n1 is connected between the other end of the n-th common transmission line CTL-n and the second terminal T2.

The second switch device SW-n2 is connected between the other end of the n-th uncommon transmission line UTL-n and the second terminal T2.

In one example, each of the first and second switch devices SW-n1 and SW-n2 of the n-th switch circuit SW-n is a BJT. In this case, the first and second switch devices SW-n1 and SW-n2 of the n-th switch circuit SW-n perform complementary switching operations depending on two control signals Vb-n1 and Vb-n2 having opposite phases to selectively connect one of the other end of the n-th common transmission line CTL-n and the other end of the n-th uncommon transmission line UTL-n to the second terminal T2.

The tunable inductor circuit described in this application be applied to a matching circuit and a filter as will be described with reference to FIGS. 5 and 6.

Figure 5:
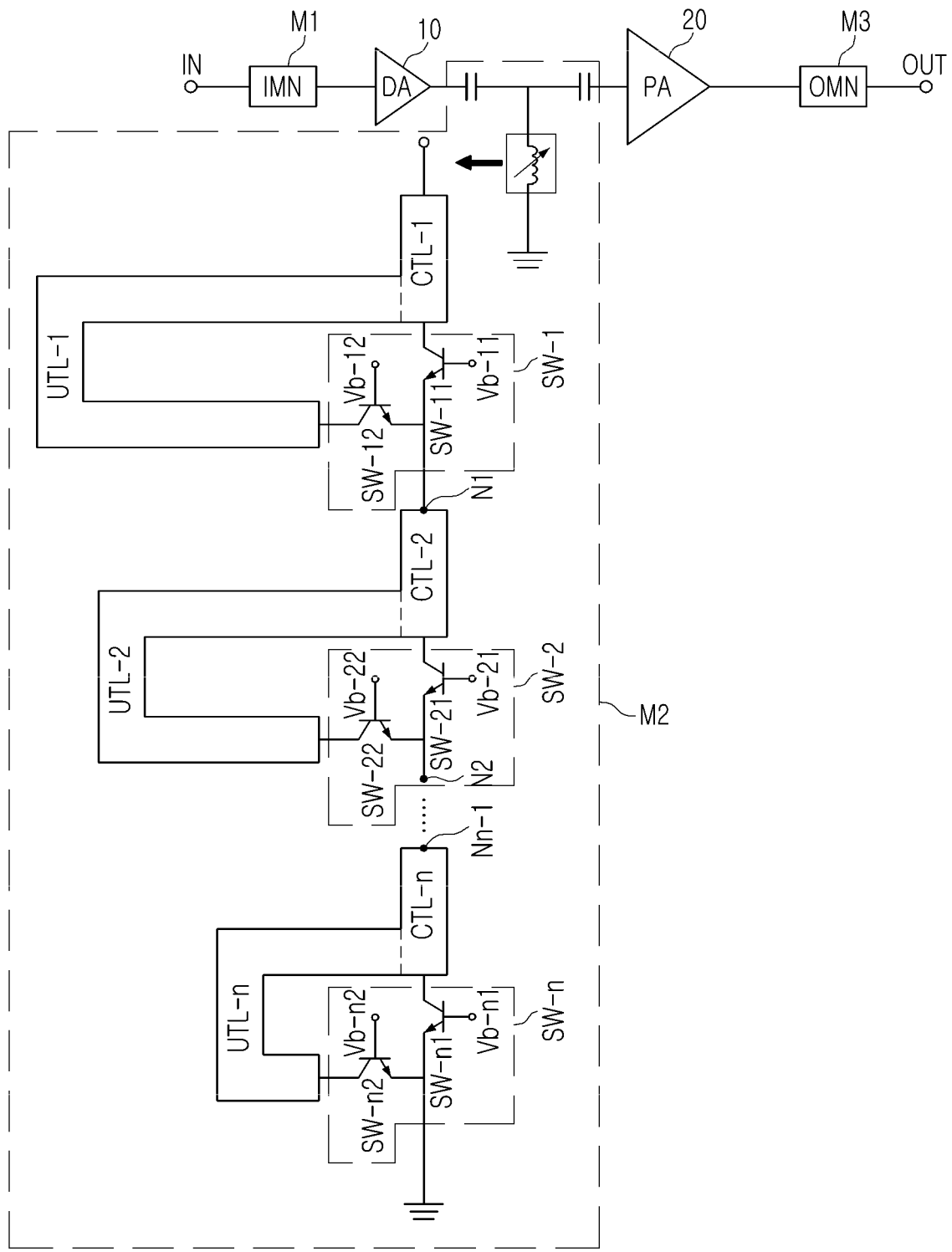
FIG. 5 is a circuit diagram illustrating an example of a tunable inductor circuit applied to a matching circuit.

FIG. 5 is a circuit diagram illustrating an example of a tunable inductor circuit applied to a matching circuit.

Referring to FIG. 5, in a power amplifying circuit including a driving amplifier 10, a power amplifier 20, an input matching circuit M1, an interstage matching circuit M2, and an output matching circuit M3, an example of the tunable inductor circuit described in this application is applied to the interstage matching circuit M2.

Figure 6:
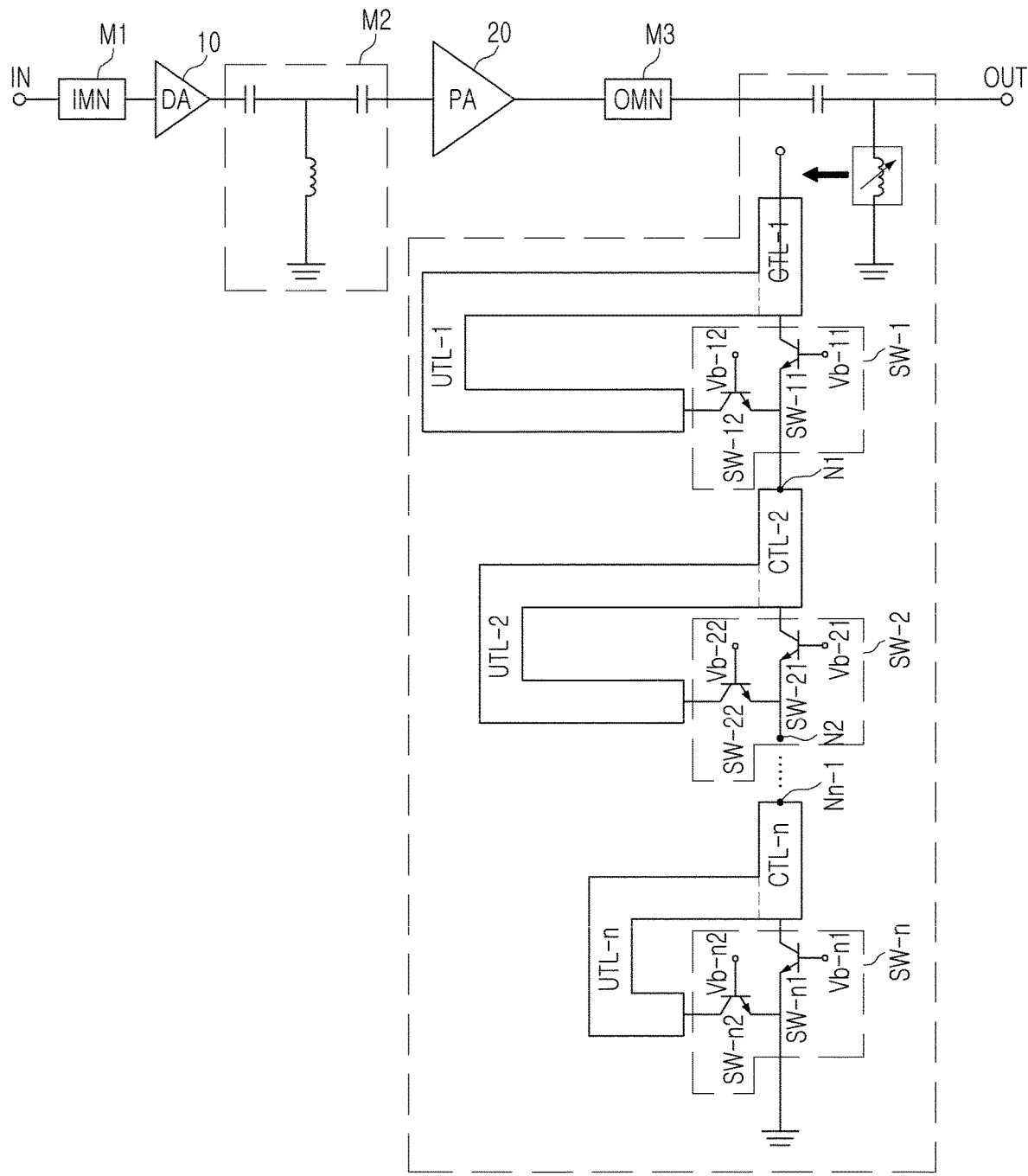
FIG. 6 is a circuit diagram illustrating an example of a tunable inductor circuit applied to a filter.

FIG. 6 is a circuit diagram illustrating an example of a tunable inductor circuit applied to a filter.

Referring to FIG. 6, in a power amplifying circuit including a driving amplifier 10, a power amplifier 20, an input matching circuit M1, an interstage matching circuit M2, and an output matching circuit M3, an example of the tunable inductor circuit described in this application is applied to a filter 30 connected to an output terminal.

Applications of the tunable inductor circuit described in this application are not limited to the examples illustrated in FIGS. 5 and 6. For example, the tunable inductor circuit described in application may also be applied to a variable inductance circuit.

Figure 7:
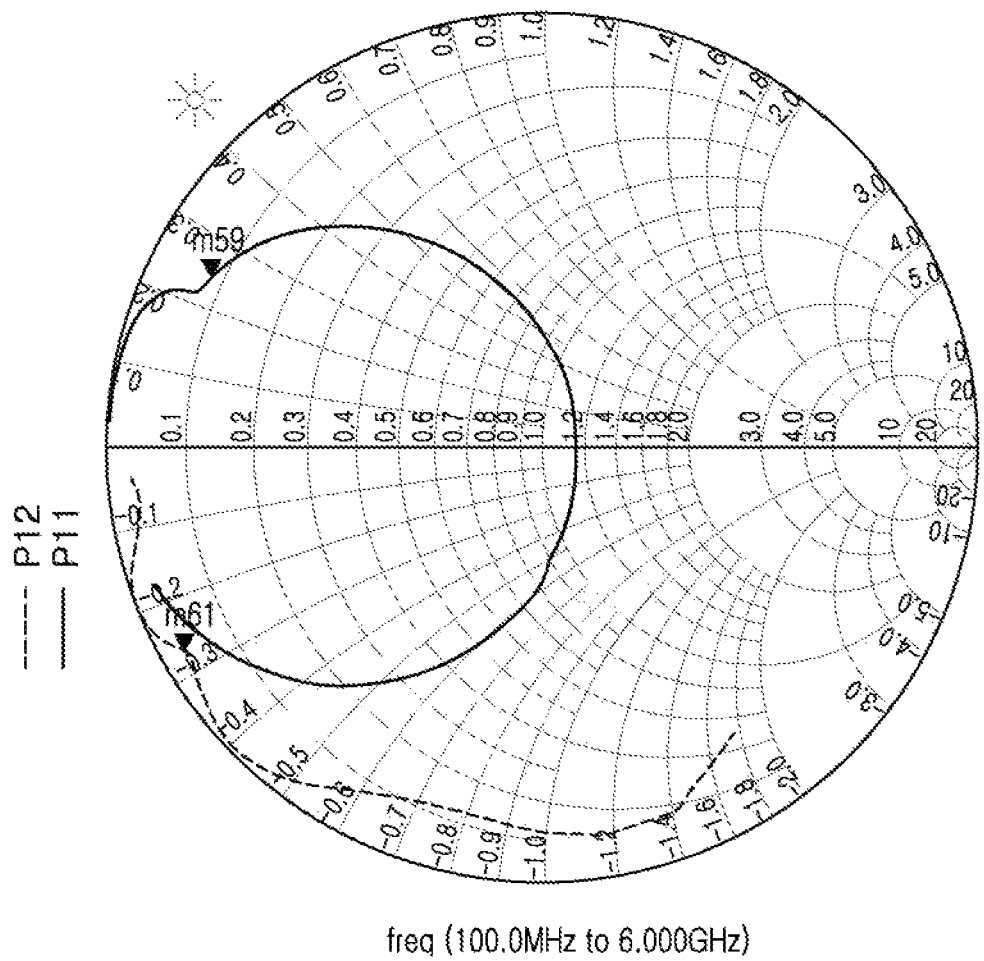
FIG. 7 is an impedance chart for a first frequency for the example of FIG. 5.
Figure 8:
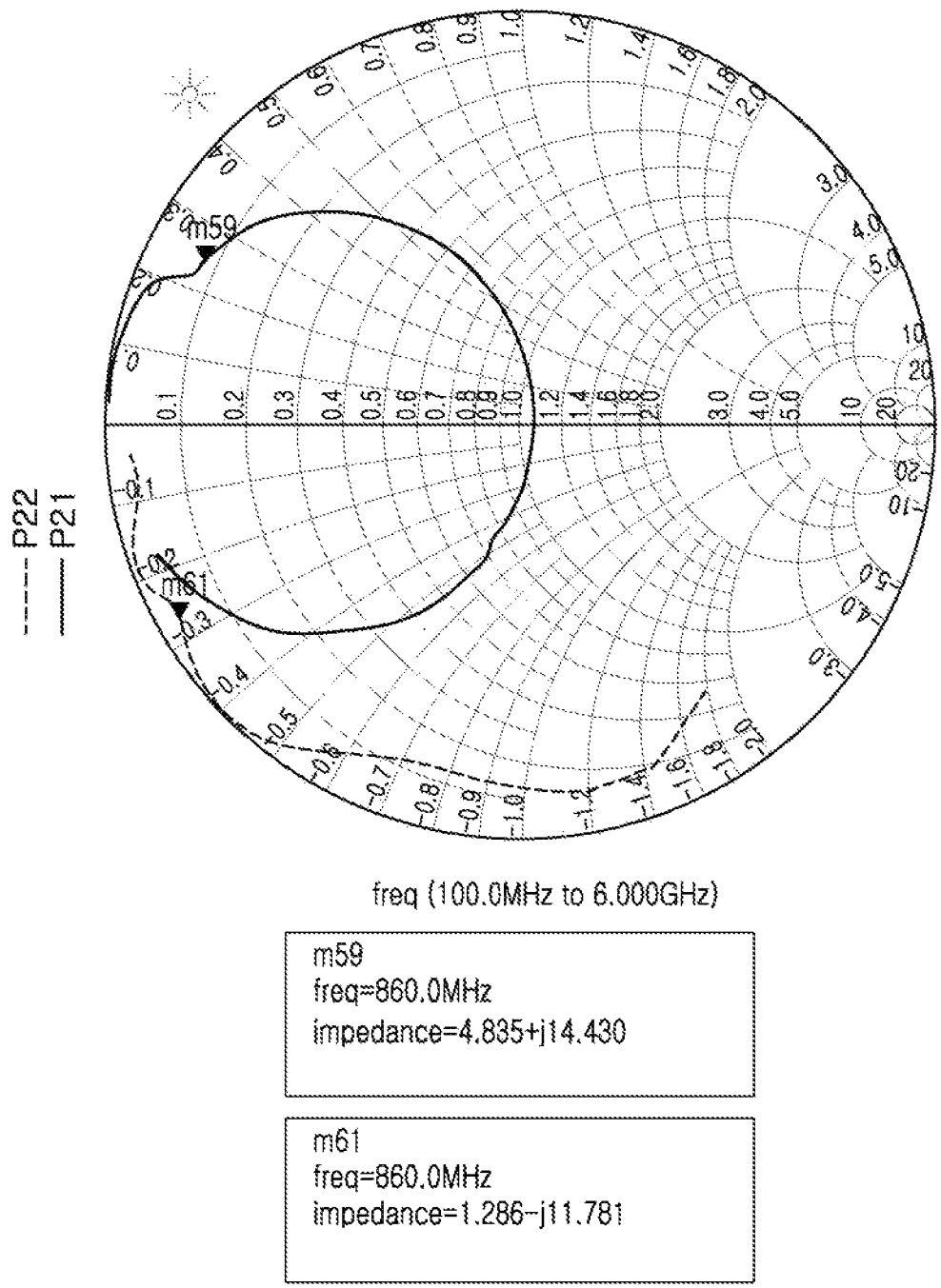
FIG. 8 is an impedance chart for a second frequency for the example of FIG. 5.

FIG. 7 is an impedance chart for a first frequency for the example of FIG. 5, and FIG. 8 is an impedance chart for a second frequency for the example of FIG. 5.

In FIG. 7, m59 denotes an output impedance of the driving amplifier 10 of FIG. 5 and m61 denotes an input impedance of the power amplifier 20 of FIG. 5 at a first frequency (for example, 760 MHz). In FIG. 8, m59 denotes an output impedance of the driving amplifier 10 of FIG. 5 and m61 denotes an input impedance of the power amplifier 20 of FIG. 5 at a second frequency (for example, 860 MHz).

FIGS. 7 and 8 show Smith charts illustrating simulation results to minimize impedance mismatching between the first frequency (760 MHz) and the second frequency (860 MHz) while varying an inductance at the first and second frequencies.

In the Smith chart of FIG. 7, a locus P11 denotes an output impedance Zout of the driving amplifier 10 viewed from the interstage matching circuit M2 in FIG. 5 toward an output of the driving amplifier 10 for a frequency range of 100.0 MHz to 6.000 GHz, and a locus P12 denotes an input impedance Zin of the power amplifier 20 viewed from the interstage matching circuit M2 toward an input of the power amplifier 20 for the frequency range of 100.0 MHz to 6.000 GHz.

In the Smith chart of FIG. 8, a locus P21 denotes an output impedance Zout of the driving amplifier 10 viewed from the interstage matching circuit M2 toward an output of the driving amplifier 10 for a frequency range of 100.0 MHz to 6.000 GHz, and a locus P22 denotes an input impedance Zin of the power amplifier 20 viewed from the interstage matching circuit M2 toward an input of the power amplifier 20 for the frequency range of 100.0 MHz to 6.000 GHz.

Referring to the simulation results of FIGS. 7 and 8, it can be seen that the input impedances of the power amplifier 20 at the first frequency (760 MHz) and the second frequency (860 MHz) are 1.549−j13.214 Ω and 1.286−j11.781Ω, respectively, and the output impedances of the driving amplifier 10 at the first frequency (760 MHz) and the second frequency (860 MHz) are 4.216+j12.048 Ω and 4.835+j14.430Ω, respectively, such that a deviation of the matching is small.

Therefore, the tunable inductor circuit described in this application enables an inductance to be appropriately adjusted to minimize impedance mismatching when a frequency is changed.

As described above, the electrical length of the transmission line may be variously adjusted using the first to n-th switch circuits, enabling optimal inductance values at different frequencies to be provided to a matching circuit, which is very useful to perform optimization over a wide band.

The tunable inductor circuit described in this application may be implemented as a variable inductance circuit in an on-chip form, enabling the variable inductance circuit to be manufactured in a small size and an electrical length of a transmission line to be varied using an external control signal.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A tunable inductor circuit, comprising:
   a first common transmission line having one end connected to a first terminal;
   a first uncommon transmission line having one end connected to another end of the first common transmission line;
   a first switch circuit configured to selectively connect one of the other end of the first common transmission line and another end of the first uncommon transmission line to a first common node;
   a second common transmission line having one end connected to the first common node;
   a second uncommon transmission line having one end connected to another end of the second common transmission line; and
   a second switch circuit configured to selectively connect one of the other end of the second common transmission line and another end of the second uncommon transmission line to a second terminal,
   wherein the second switch circuit comprises:
      a first switch device connected between the other end of the second common transmission line and the second terminal; and
      a second switch device connected between the other end of the second uncommon transmission line and the second terminal.

2. A tunable inductor circuit, comprising:
   a first common transmission line having one end connected to a first terminal;
   a first uncommon transmission line having one end connected to another end of the first common transmission line;
   a first switch circuit configured to selectively connect one of the other end of the first common transmission line and another end of the first uncommon transmission line to a first common node;
   a second common transmission line having one end connected to the first common node;
   a second uncommon transmission line having one end connected to another end of the second common transmission line; and
   a second switch circuit configured to selectively connect one of the other end of the second common transmission line and another end of the second uncommon transmission line to a second terminal,
   wherein the first switch circuit comprises:
      a first switch device connected between the other end of the first common transmission line and the first common node; and
      a second switch device connected between the other end of the first uncommon transmission line and the first common node.

3. The tunable inductor circuit of claim 1, wherein the first switch device comprises a first bipolar junction transistor (BJT);
   the second switch device comprises a second BJT; and
   the first BJT and the second BJT are configured to perform complementary switching operations in which one of the first BJT and the second BJT is on and another one of the first BJT and the second BJT is off in response to respective control signals having opposite phases.

4. The tunable inductor circuit of claim 1, wherein the second switch circuit comprises:
   a third switch device connected between the other end of the second common transmission line and the second terminal; and
   a fourth switch device connected between the other end of the second uncommon transmission line and the second terminal.

5. The tunable inductor circuit of claim 1, wherein a transmission length of the first common transmission line is different from a transmission length of the second uncommon transmission line.

6. A tunable inductor circuit, comprising:
   first to n-th common transmission lines included in a common signal path;
   first to n-th uncommon transmission lines included in a bypass signal path; and
   first to n-th switch circuits,
   wherein the first common transmission line has one end connected to a first terminal included in the common signal path, the first uncommon transmission line has one end connected to another end of the first common transmission line, and the first switch circuit is configured to selectively connect one of the other end of the first common transmission line and another end of the first uncommon transmission line to a first common node included in the common signal path,
   wherein the second common transmission line has one end connected to the first common node, the second uncommon transmission line has one end connected to another end of the second common transmission line, and the second switch circuit is configured to selectively select one of the other end of the second common transmission line and another end of the second uncommon transmission line to a second common node included in the common signal path, and wherein the n-th common transmission line has one end connected to an n−1-th common node included in the common signal path, the n-th uncommon transmission line has one end connected to another end of the n-th common transmission line, and the n-th switch circuit is configured to selectively connect one of the other end of the n-th common transmission line and another end of the n-th uncommon transmission line to a second terminal included in the common signal path, and wherein the first switch circuit comprises:
- a first switch device connected between the other end of the first common transmission line and the first common node; and
- a second switch device connected between the other end of the first uncommon transmission line and the first common node.

7. The tunable inductor circuit of claim 6, wherein respective transmission lengths of the first to n-th common transmission lines are different from one another.

8. The tunable inductor circuit of claim 6, wherein the first switch device comprises a first bipolar junction transistor (BJT);
the second switch device comprises a second BJT; and
the first BJT and the second BJT are configured to perform complementary switching operations in which one of the first BJT and the second BJT is on and another one of the first BJT and the second BJT is off in response to respective control signals having opposite phases.

9. The tunable inductor circuit of claim 6, wherein the second switch circuit comprises:
- a third switch device connected between the other end of the second common transmission line and the second common node; and
- a fourth switch device connected between the other end of the second uncommon transmission line and the second common node.

10. The tunable inductor circuit of claim 6, wherein the n-th switch circuit comprises:
- a third switch device connected between the other end of the n-th common transmission line and the second terminal; and
- a fourth switch device connected between the other end of the n-th uncommon transmission line and the second terminal.

11. A tunable inductor circuit, comprising:
- a common transmission line connected between a first terminal and a second terminal;
- n switch circuits connected inline in the common transmission line at n−1 nodes and the second terminal; and
- n loop transmission lines each having a first end connected to the common transmission line, and a second end connected to a respective one of the n switch circuits, wherein each of the n switch circuits is configured to receive a first signal from the common transmission line and output the first signal to a respective one of the n−1 nodes and the second terminal in a first switching state, and receive a second signal from a respective one of the n loop transmission lines and output the second signal to the respective one of the n−1 nodes and the second terminal in a second switching state, and wherein each of the n switch circuits comprises:
- a first switch device connected inline in the common transmission line at a respective one of the n−1 nodes and the second terminal; and
- a second switch device connected between the second end of a respective one of the n loop transmission lines and the respective one of the n−1 nodes and the second terminal.

12. The tunable inductor circuit of claim 11, wherein the n−1 nodes are disposed at unequal intervals in the common transmission line.

13. The tunable inductor circuit of claim 11, wherein respective transmission lengths of the n loop transmission lines are different from one another.

14. The tunable inductor circuit of claim 11, wherein the first switch device comprises a first bipolar junction transistor (BJT);
the second switch device comprises a second BJT; and
the first BJT and the second BJT are configured to perform complementary switching operations in which one of the first BJT and the second BJT is on and another one of the first BJT and the second BJT is off in response to respective control signals having opposite phases.

* * * * *